United States Patent
Collin

(10) Patent No.: US 10,443,977 B2
(45) Date of Patent: Oct. 15, 2019

(54) COMBINATION REFLECTIVE AND HOLOGRAPHIC WEAPON SIGHT

(71) Applicant: Ziel Optics, Inc., Ann Arbor, MI (US)

(72) Inventor: Fred Collin, Brighton, MI (US)

(73) Assignee: Ziel Optics, Inc., Ann Arbor, MI (US)

( * ) Notice: Subject to any disclaimer, the term of this patent is extended or adjusted under 35 U.S.C. 154(b) by 193 days.

(21) Appl. No.: 15/383,417

(22) Filed: Dec. 19, 2016

(65) Prior Publication Data

US 2017/0176138 A1 Jun. 22, 2017

Related U.S. Application Data

(60) Provisional application No. 62/269,657, filed on Dec. 18, 2015.

(51) Int. Cl.
*G02B 5/32* (2006.01)
*F41G 1/30* (2006.01)
(Continued)

(52) U.S. Cl.
CPC .............. *F41G 1/30* (2013.01); *F41G 1/345* (2013.01); *G02B 5/32* (2013.01); *G02B 23/105* (2013.01);
(Continued)

(58) Field of Classification Search
CPC ............ G02B 27/0149; G02B 27/0103; G02B 27/0189; G02B 27/0944; G02B 2027/015; G02B 2027/019–0196; G02B 23/10; G02B 23/24446; G02B 23/2461; G02B 23/2476; G03H 1/00; G03H 1/02; G03H 1/0005; G03H 1/22; G03H 2001/2284; G03H 2001/0232; G03H 2001/0212; G03H 2001/2247; G03H 2001/2252; G03H 2227/06; G03H 2227/03; G03H 1/2249; G03H 2001/0434; G03H 2001/2255; G03H 2001/2289; G03H 2001/261; F41G 1/38; F41G 1/545; F41G 1/54; F41G 1/383; F41G 1/473; F41G 1/04; F41G 1/02; F41G 1/32; F41G 1/35; F41G 1/065; F41G 1/30; F41G 1/345; F41G 11/00; F41G 11/003;
(Continued)

(56) References Cited

U.S. PATENT DOCUMENTS 5,355,224 A 10/1994 Wallace
6,490,060 B1 12/2002 Tai et al.
(Continued)

*Primary Examiner* — Stephone B Allen
*Assistant Examiner* — Jyotsna V Dabbi
(74) *Attorney, Agent, or Firm* — Dinsmore & Shohl LLP

(57) ABSTRACT

A compact sight device has a housing with a viewing and a target end. A light source projects a light beam along a path. A holographic optical element (HOE) is disposed in the path of the light beam such that the HOE is illuminated by the light beam at an incidence angle defined with respect to a line perpendicular to the surface of the HOE. The HOE reconstructs an object beam with an image of a reticle, the object beam having an object beam angle measured with respect to the line perpendicular to the surface of the HOE. The incidence angle and the object beam angle are substantially equal. The HOE further reflects a portion of the light beam at a reflection angle substantially equal to the object beam angle such that a user viewing the object beam will also see a reflected image of the light source.

10 Claims, 3 Drawing Sheets

(51) Int. Cl.
  *F41G 1/34* (2006.01)
  *G02B 27/09* (2006.01)
  *H01S 5/183* (2006.01)
  *H01S 5/00* (2006.01)
  *G02B 23/10* (2006.01)

(52) U.S. Cl.
  CPC ........ *G02B 27/0944* (2013.01); *H01S 5/0071* (2013.01); *H01S 5/183* (2013.01); *H01S 5/005* (2013.01)

(58) Field of Classification Search
  CPC ........ F41G 11/001; F41G 11/008; F41G 3/00; F41G 3/005; F41G 3/02; F41G 3/08; F41G 5/00; F41A 27/00; H01S 5/06804; H01S 5/183; H01S 5/0071; H01S 5/005
  USPC .......................................................... 359/15
  See application file for complete search history.

(56) References Cited

U.S. PATENT DOCUMENTS

| | | | |
|---|---|---|---|
| 2005/0057808 A1* | 3/2005 | Houde-Walter | F41C 27/00 359/566 |
| 2005/0225853 A1* | 10/2005 | Hakansson | F41G 1/30 359/399 |
| 2006/0164704 A1* | 7/2006 | Sieczka | F41G 1/30 359/15 |
| 2014/0075820 A1* | 3/2014 | Ben-Ami | F41G 1/30 42/123 |
| 2015/0198415 A1 | 7/2015 | Campean | |
| 2015/0267997 A1 | 9/2015 | Collin et al. | |

* cited by examiner

COMBINATION REFLECTIVE AND HOLOGRAPHIC WEAPON SIGHT

CROSS REFERENCE TO RELATED APPLICATION

This application claims priority to U.S. provisional application Ser. No. 62/269,657 filed Dec. 18, 2015 entitled "Combination Reflective and Holographic Weapon Sight", which is incorporated herein in its entirety by reference.

FIELD OF THE INVENTION

The present invention relates generally to sighting devices that generate a reticle for aiming weapons or other optical devices.

BACKGROUND OF THE INVENTION

There are several types of sights available in the market to enable a user of optical devices or weapons such as rifles, shotguns, handguns, and submachine guns to aim these weapons. Examples of such sighting devices include laser sights, holographic sights, "reflex," or "red dot" sights etc. Some of the available sights have a laser as their light source. The light may be used to create an image of a reflex or red dot. However, these images are susceptible to drift due to a change in the output wavelength of the laser source because of changing environmental conditions and may introduce error in aiming a weapon/optical device.

Laser diodes are used in a wide variety of applications that require a narrow spectral width. However, the wavelength of the light produced by the laser diode varies depending on a number of factors, including the temperature of the laser diode. For example, some laser diodes will exhibit a shift in output wavelength of approximately 0.30 nm/° C. The change in temperature of the laser diode may be due to environmental conditions or due to heating from operation of the diode. For some applications, this shift in wavelength is not a problem. However, for other applications, such as certain holographic gun sights, this shift in wavelength will cause the holographic gun sight to be inaccurate.

In typical a holographic gun sight, a holographic optical element (HOE) is illuminated by a reconstruction beam, from a laser diode, and reconstructs an image of a reticle as an object beam. The reconstruction beam typically does not illuminate the HOE perpendicular to the surface but instead is angled at a beam angle. Depending on how the HOE is made or recorded, the object beam is also at an angle to perpendicular. These angles are typically not equal (on opposite sides of perpendicular). In such a case, the actual object beam angle will vary depending on the wavelength of the reconstruction beam. This is called dispersion. As the wavelength of the reconstruction beam shifts, the diffraction angle from a holographic element will change, which will result in movement of the reconstructed holographic image and give an inaccurate reticle position relative to the target.

To correct for this change in wavelength, some sights are configured such that the system of holographic optical elements form an achromat to compensate for changes in wavelength. Another approach to addressing this problem is to control the temperature of the laser diode, such as through the use of a thermoelectric device or TEC cooler. However, this approach is not considered practical in low-power applications such as a gun sight. In applications where such control is practical, the control may be open or closed loop. An open loop control may be used, such as a temperature sensor attached to the laser diode. As the sensor temperature changes the TEC cooler will be adjusted. For a closed loop system, the wavelength output by the laser diode may be directly monitored. This information is then used to adjust the temperature of the laser diode via the thermoelectric cooler, and bring the diode back to the target wavelength. While thermal control of the laser diode is effective in preventing a change in wavelength, thermoelectric controllers are large in comparison to the laser diode and may draw a current in excess of 0.5 amps. For either case, using a thermoelectric cooler increases the physical size of the laser source assembly and greatly increases its energy requirements. For this reason, thermoelectric controllers in gun sights are impractical and undesirable at this time.

SUMMARY OF THE INVENTION

The present invention provides various embodiments of a sight device. According to an embodiment, a compact sight device has a housing with a viewing and a target end. A light source projects a light beam along a path. A holographic optical element (HOE) is disposed in the path of the light beam such that the HOE is illuminated by the light beam at an incidence angle defined with respect to a line perpendicular to the surface of the HOE. The HOE reconstructs an object beam with an image of a reticle, the object beam having an object beam angle measured with respect to the line perpendicular to the surface of the HOE. The incidence angle and the object beam angle are substantially equal. The HOE further reflects a portion of the light beam at a reflection angle substantially equal to the object beam angle such that a user viewing the object beam will also see a reflected image of the light source.

In some versions, the light source has a laser diode operable to emit the beam of light when energized. The laser diode may be a vertical-cavity surface-emitting laser diode (VCSEL).

Certain embodiments may further include a lens disposed in the path of the beam of light and operable to collimate the beam of light, the collimated beam of light illuminating the HOE.

In some versions, the reconstructed reticle is without a center dot.

In some versions, the sign further includes a mirror disposed in the path of the light beam so as to reflect the beam of light onto the HOE.

In certain versions, the HOE is disposed in the viewing path.

Some versions further include a non-diffraction element (NDE) reflecting the image of the reticle, the non-diffraction element being disposed in the viewing path such that a user views a target along the viewing path through the non-diffraction element from the viewing end. In these versions, the HOE is not disposed in the viewing path. The non-diffraction element (NDE) may be selected from the group consisting of a partial mirror, a glass element and an optical element with a dichroic film coating.

A compact sight device according to the present invention may be a weapon sight or another type of sight.

BRIEF DESCRIPTION OF THE DRAWINGS

The accompanying drawings, which are included to provide a further understanding of the invention and are incorporated in and constitute a part of this application, illustrate embodiment (s) of the invention and together with the description serve to explain the principle of the invention. In the drawings.

DETAILED DESCRIPTION OF THE INVENTION

The present invention provides embodiments of a combination reflective and holographic weapon sight. Such as a weapon sight may take a variety of forms. Certain examples of the present invention are shown in the Figures. However, the present invention is not limited to the illustrated embodiments. Additional advantages, objects, and features of the invention will be set forth in part in the description that follows and in part will become apparent to those having ordinary skill in the art upon examination of the following or may be learned from practice of the invention.

One embodiment of the present invention provides for aiming a weapon sight and/or an optical device with a holographic image of a reticle that combines a reflected red dot as a center point, wherein the reticle may or may not lack a center dot. Such a reticle that lacks a center dot may be called an outer reticle and the term "reticle" is generic to an image with or without a center dot. Such a combination, if constructed in accordance with the present invention, may be immune to image drift due to wavelength changes of the light provided by the light source. Depending on the optical elements, the reflected center dot may have a focal depth effectively at infinity, while the holographic reticle will not drift because that reconstruction beam angle and object beam angle are the same.

Figure 1:
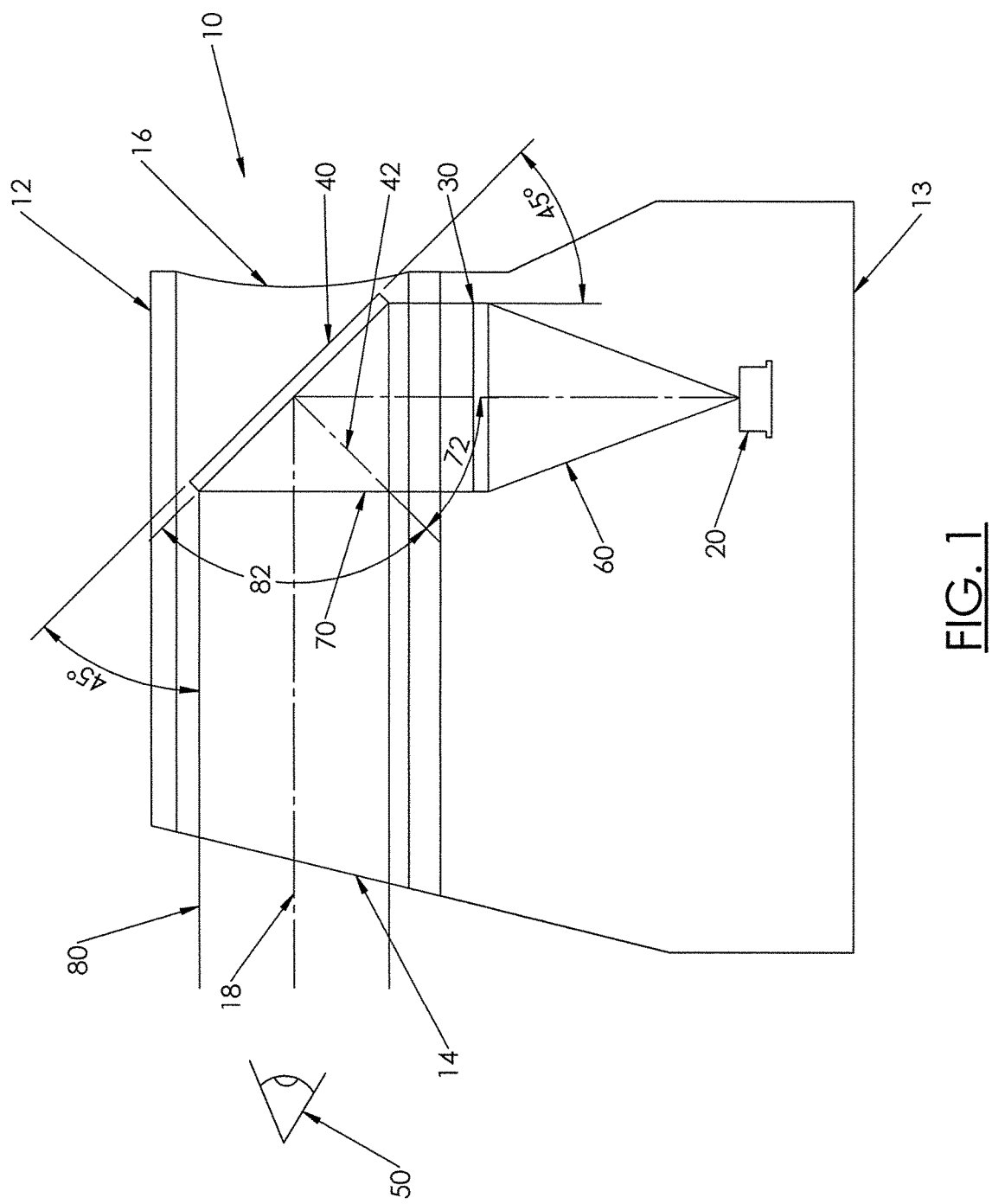
FIG. 1 is a schematic drawing showing a gun sight in accordance with the present invention with a first light beam path illustrated as a diagram.

FIG. 1 is a schematic drawing showing an embodiment of a combination reflective and holographic weapon sight 10 in accordance with the present invention. The sight has a housing 12 with a viewing end 14 and an opposing target end 16. A viewing path 18 may be defined from the viewing end to the target end, and represents a line along which a user's eye 50 views a target. The sight 12 may be integrated with a weapon or may have a lower end 13 having any of a variety of clamping mechanisms for attachment to a weapon. The sight 10 is illustrated schematically. It should be understood that an actual sight embodying the present invention may take a variety of physical forms.

A laser source, such as a vertical-cavity surface-emitting laser (VCSEL) or other laser diode is shown at 20. It produces a diverging beam of generally coherent laser light 60, which passes through lens 30 to generate a generally collimated beam 70, which illuminates hologram plate 40 (also referred to as a holographic optical element, HOE). As shown, the angle 72 between light beam 70 and a line 42 perpendicular to the hologram plate 40 may be around 45°. Part of the light illuminating hologram plate 40 is reflected as a light beam 80 toward the eye 50 of a user. This provides a reflected image of the laser source 20, which will appear as a red dot, with a focal depth determined by the optical elements. As shown, the angle 82 between light beam 80 and the line 42 may also be around 45°. The angle of incidence 72 of the beam 70 will equal the angle of reflection 82 of the beam 80. Other embodiments may use angles other than 45°.

The illumination of hologram plate 40 also reconstructs a holographic image, which is visible to the user's eye 50. In some embodiments, this image may be a reticle, such as an outer reticle that lacks a center dot. Beam 80 also represents the object beam reconstructed by the hologram plate 40. According to preferred embodiments of the present invention, the reconstruction beam angle 72 and the object beam angle 82 are substantially equal. As such, the object beam angle should not change in a meaningful way if the wavelength of the light source 20 drifts. Therefore, the position of the reflected red dot and the reconstructed reticle should be stable. A sight incorporating the elements of FIG. 1 may be constructed in a variety of ways, and may include additional optical elements. In the embodiment of FIG. 1, a user views a target along the viewing path through the hologram plate or HOE 40.

Figure 2:
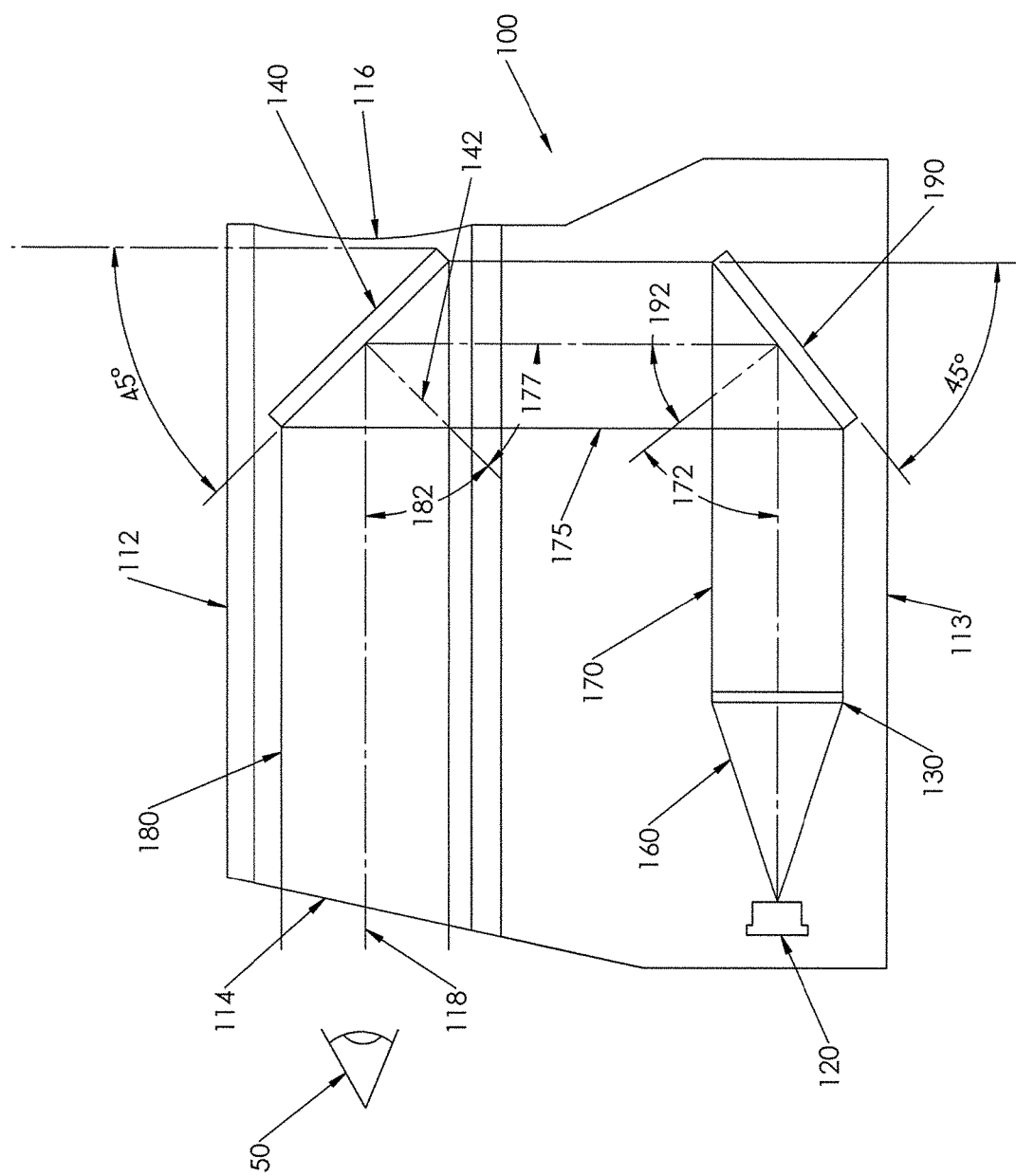
FIG. 2 is a schematic drawing showing another gun sight in accordance with the present invention with a second light beam path illustrated as a diagram.

FIG. 2 shows a light beam path diagram of another embodiment of a combination reflective and holographic weapon sight 100 in accordance with the present invention. Not all elements shown in FIG. 2 are required for all versions or embodiments. A laser source, such as a VCSEL or other laser diode is shown at 120. It produces a diverging beam of generally coherent laser light 160, which passes through lens 130 to generate a generally collimated beam 170, which illuminates a mirror 190. Mirror 190 then reflects the light beam 175 onto a hologram plate 140. Light beam 175 is therefore the reconstruction beam. The angle of incidence 172 and angle of reflection 192 of the mirror 190 are the same. In the illustrated embodiment, both are about 45°. Hologram plate 140 reconstructs an image of a reticle, as an object beam towards a user's eye 50 as object beam 180. As shown, the angle 177 between reconstruction beam 175 and the illuminated surface of hologram plate 140 may be around 45°. As with the embodiment of FIG. 1, the object beam angle 182 is equal to the reconstruction beam angle 177.

The mirror 190 may be selected from the group consisting of a mirror, a partial mirror, a glass element, and an optical element with a dichroic film coating. Part of the light illuminating hologram plate 140 is reflected as light beam 180 towards the eye 50 of a user. This provides a reflected image of the laser source 120, which will appear as a red dot, with a focal depth determined by the optical elements. The illumination of the hologram plate 140 also reconstructs a holographic image, which is visible to the user's eye 50. In some embodiments, this image may be a reticle, such as an outer reticle that lacks a center dot. A user's eye 50 can view the image of the reticle, red dot and a target (not shown) through the hologram plate 140. In certain embodiments, the mirror 190 may be substituted with a holographic optical element.

A further alternative embodiment of the present invention may also be represented by FIG. 2. In this embodiment, element 190 is the hologram plate and beam 175 is both the object beam and the reflected beam. Element 140 represents a non-diffraction element (NDE), which may consist of a partial mirror, glass or dichroic film coating. As used herein, an NDE is defined as an optical element for redirecting a pattern of light while preserving wavefront and diffracted pattern characteristics. As such, an NDE is not a holographic optical element (HOE). When the hologram plate 140 (an HOE) reconstructs the image of a reticle, this image may be reflected in or by the NDE. Thus, the NDE may serve two functions for the sight. The NDE reflects the image such that it may be viewed by a user's eye. Additionally, a user may view a target through the same NDE such that the reticle is superimposed on the target. This facilitates a user for aiming the weapon or optical device. Therefore, a user views the reticle and the target through the NDE, not through an HOE. The NDE reflects more light and avoids a rainbow effect. The NDE may also be easier to see through than a hologram plate, making the target easier to see. It is noted that in the embodiments of FIGS. 1 and 2, the HOE is a reflection-type holographic optical element.

The sights shown in FIGS. 1 and 2 may be constructed in a variety of ways, and may include additional optical elements. As shown, there is a reflection of the reference beam into the user's eye. This may be advantageous because a reflected plane wave will appear as a dot focused very far away (say 100 m for a reticle). If the hologram is of a circle focused at 100 m, and properly aligned with the plane wave, a reticle is formed. These embodiments may not need compensation for the reticle because both angles are equal (≈45° in these examples, though other angles may be used) and the light beam is collimated by a lens.

Figure 3:
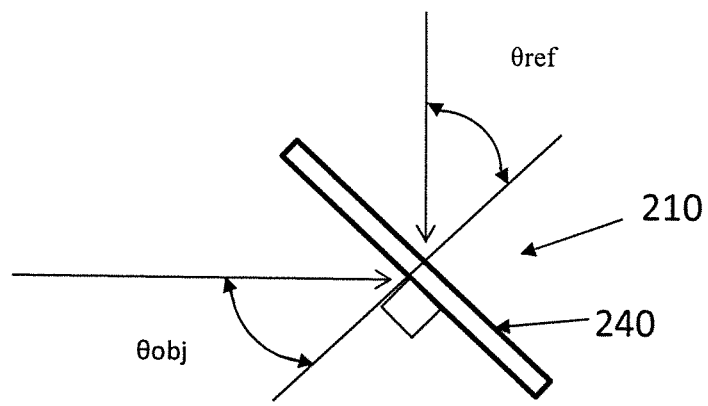
FIG. 3 is a schematic drawing of a recording layout for an hologram plate.

FIG. 3 illustrates a recording layout 210 for recording a holographic image onto an HOE 240, showing an object beam and reference beam incident on the HOE. These angles will be referenced later in this discussion.

As will be clear to those of skill in the art, the configuration of FIGS. 1 and 2 may result in the reflected center dot being brighter than the reconstructed reticle. A user may prefer that the center dot brightness be similar to the reticle brightness, or that the relative brightness be adjustable. The brightness of the reticle may be adjusted in certain ways, but the maximum brightness of the reticle may still be less bright than the reflected center dot. Therefore, it may be desirable to adjust the brightness of the center dot. There are a few ways to accomplish this.

Figure 4:
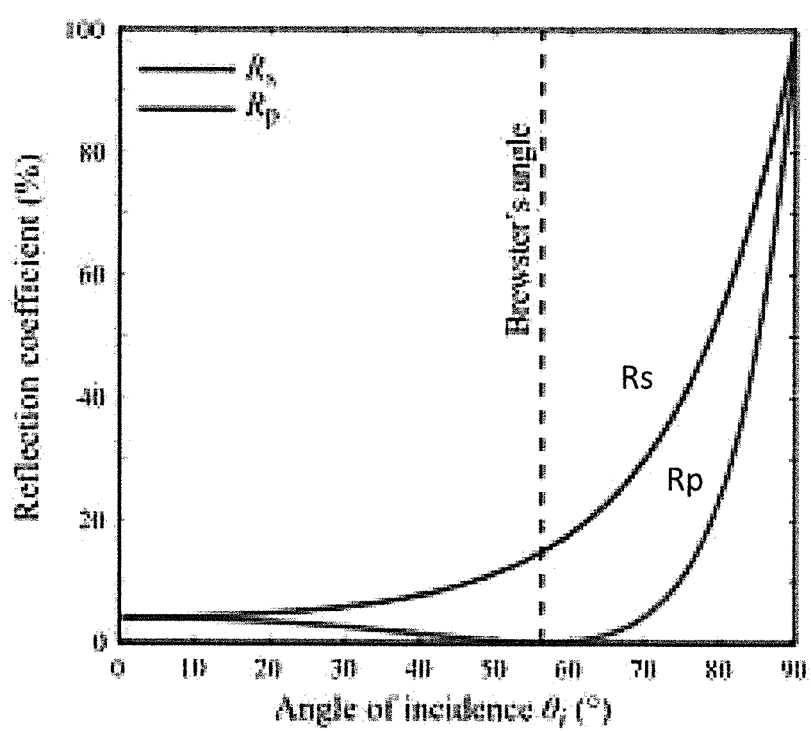
FIG. 4 is a graph showing how the reflection coefficient changes with the angle of incidence.

As a starting point, FIG. 4 provides a graph of reflection coefficient versus the angle of incidence for two different types of polarized light, s polarized (Rs) and p polarized (Rp). Generally, the amount of light reflected from a surface increases as the angle of incidence increases. However, as shown for the Rp line, there is an angle at which the reflection coefficient drops to approximately zero. This is called Brewster's angle. Brewster's angle may be used for both the reference and object beams. Brewster's angle is an angle of incidence at which light with a particular polarization is perfectly transmitted through a transparent dielectric surface, with no reflection. When unpolarized light is incident at this angle, the light that is reflected from the surface is therefore perfectly polarized. Polarization of the diode may be maintained for Brewster's angle to be valid. It is possible that rotating the diode can control the brightness of the center dot by a small amount, since rotating the diode will change the polarization. This means that at Brewster's angle, the reflected plane wave will be at its lowest possible power. This may be dependent on using p polarized light. As will be clear from FIG. 4, the amount of light reflected may be changed by changing the angle at which the light beam (70 in FIG. 1) is incident on the HOE (i.e. the reflective surface). It may be desirable to be close to Brewster's angle, depending on the type of light. As such, the sight may be constructed with a different angle or angles than shown in FIGS. 1 and 2. The choice of angle will typically be designed into the sight and not adjustable by a user. This provides one approach to choosing the relative brightness of the center dot. Adjusting the polarization, such as by rotating the diode, is another approach.

A substantially dispersion-free and wavelength-independent hologram may depend on various transmission holo-gram equations. All angles are measured with respect to the plate surface normal. R is the radius of wave-front curvature that is measured at the plate. R>0, R<0, and R=∞ means that the light source is a diverging source, a converging source, and a collimated source or plane wave, respectively.

First, an angle equation (sin θ) is a combination of the interference and diffraction equations. It describes the behavior of a single point on a hologram made with two sources of one wavelength, and illuminated by a third source of another wavelength.

$$\sin\theta_{out} = m\frac{\lambda_{ill}}{\lambda_{exp}}(\sin\theta_{obj} - \sin\theta_{ref}) + \sin\theta_{ill} \quad (1)$$

If both angles are equal in equation 1, sin $\theta_{obj}$=sin $\theta_{ref}$ may be used for making and sin $\theta_{out}$=sin $\theta_{ill}$ may be used for readout, wherein m may be the diffracted order. m=1 or −1 may be assumed for this purpose.

Second, horizontal focus equation computes where a horizontal detail (vertical lines) of an object is focused, given the radius of curvature of a representative object point, a reference and an illumination source.

$$\frac{1}{R_{out}} = m\frac{\lambda_{ill}}{\lambda_{exp}}\left(\frac{1}{R_{obj}} - \frac{1}{R_{ref}}\right) + \frac{1}{R_{ill}} \quad (2)$$

If $R_{ref}$ and $R_{ill}$ are very large in equation 2, i.e. it may be a plane wave or close to a plane wave, then the two values disappear and equation (2) will become $$\frac{1}{Rout} = \frac{m\lambda ill}{\lambda\exp}\left(\frac{1}{Robj}\right)$$

Third, vertical focus equation computes the location of a vertical detail (horizontal lines) of the image of an object. Vertical focus is also known as color focus. To compute the vertical focus R, first, the angle equation may be used and then the angle values may be substituted to solve for R.

$$\frac{\cos^2\theta_{out}}{R_{out}} = m\frac{\lambda_{ill}}{\lambda_{exp}}\left(\frac{\cos^2\theta_{obj}}{R_{obj}} - \frac{\cos^2\theta_{ref}}{R_{ref}}\right) + \frac{\cos^2\theta_{ill}}{R_{ill}} \quad (3)$$

If $R_{ref}$ and $R_{ill}$ are very large, i.e. it may be a plane wave or close to a plane wave, then the two values disappear and equation (3) will become $$\frac{\cos\theta out^2}{Rout} = \frac{m\lambda ill}{\lambda\exp}\left(\frac{\cos\theta obj^2}{Robj}\right)$$

The two cos terms in the equation above are the same because both angles were assumed to be equal. Then the cos squared terms may be divided out such that equation (3) is equal to equation (2) such that $$\frac{1}{Rout} = \frac{m\lambda ill}{\lambda\exp}\left(\frac{1}{Robj}\right)$$

As will be clear to those of skill in the art, the embodiments disclosed and discussed herein may be altered in various ways without departing from the scope or teaching of the present invention. As one non-limiting example, while the embodiments have been described as weapon sights, the present invention may also be used for sighting devices not for weapons. Thus, it is intended that the present invention covers the modifications and variations of this invention provided they come within the scope of the appended claims and their equivalents.

The invention claimed is:

1. A compact sight device, comprising:
a housing having a viewing end and an opposing target end, a viewing path being defined from the viewing end to the target end;
a light source operable to project a light beam along a path;
a holographic optical element (HOE) disposed in the path of the light beam such that the HOE is illuminated by the light beam at an incidence angle defined with respect to a line perpendicular to a surface of the HOE, the HOE reconstructing an object beam with an image of a reticle, the reconstructed object beam having an object beam angle measured with respect to the line perpendicular to the surface of the HOE, the incidence angle and the object beam angle defined as being on opposite sides of the perpendicular line, the incidence angle and the object beam angle being substantially equal;
the HOE further reflecting a portion of the light beam at a reflection angle substantially equal to the reconstructed object beam angle such that a user viewing the object beam will also see a reflected image of the light source.

2. The compact sight device of claim 1, wherein the light source has a laser diode operable to emit the beam of light when energized.

3. The compact sight according to claim 2, wherein the laser diode is a vertical-cavity surface-emitting laser diode (VCSEL).

4. The compact sight device of claim 1, further comprising a lens disposed in the path of the beam of light and operable to collimate the beam of light, the collimated beam of light illuminating the HOE.

5. The compact sight device of claim 1, wherein a reconstructed reticle is without a center dot.

6. The compact sight device of claim 1, further comprising a mirror disposed in the path of the light beam so as to reflect the beam of light onto the HOE.

7. The compact sight device f claim 1, wherein the HOE is disposed in the viewing path.

8. The compact sight device of claim 1, further comprising a non-diffraction element (NDE) reflecting the image of the reticle, the non-diffraction element being disposed in the viewing path such that a user views a target along the viewing path through the non-diffraction element from the viewing end; and the HOE is not disposed in the viewing path.

9. The compact sight device of claim 8, wherein the non-diffraction element (NDE) is selected from the group consisting of a partial mirror, a glass element and an optical element with a dichroic film coating.

10. The compact sight device of claim 1, wherein the compact sight is a weapon sight.

* * * * *